(12) United States Patent
Pirovano

(10) Patent No.: US 10,910,052 B2
(45) Date of Patent: *Feb. 2, 2021

(54) MATERIAL IMPLICATION OPERATIONS IN MEMORY

(71) Applicant: Micron Technology, Inc., Boise, ID (US)

(72) Inventor: Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/547,727

(22) Filed: Aug. 22, 2019

(65) Prior Publication Data

US 2019/0378571 A1 Dec. 12, 2019

Related U.S. Application Data

(63) Continuation of application No. 15/853,803, filed on Dec. 24, 2017, now Pat. No. 10,424,376.

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/003* (2013.01); *G11C 13/0004* (2013.01);
(Continued)

(58) Field of Classification Search
CPC ............ G11C 13/0069; G11C 13/0004; G11C 13/003; G11C 13/0023; G11C 2213/71;
(Continued)

(56) References Cited

U.S. PATENT DOCUMENTS 7,440,316 B1 * 10/2008 Lee .......................... G11C 8/08
365/148
8,014,187 B2 * 9/2011 Kang ................. G11C 13/0004
365/148
(Continued)

FOREIGN PATENT DOCUMENTS

EP          2736044 A1     5/2014
KR      101473514 B1    12/2014
(Continued)

OTHER PUBLICATIONS

International Search Report and Written Opinion from related international application No. PCT/US2018/064656, dated Apr. 3, 2019, 11 pp.

(Continued)

*Primary Examiner* — Tha-O H Bui
(74) *Attorney, Agent, or Firm* — Brooks, Cameron & Huebsch, PLLC

(57) ABSTRACT

The present disclosure includes apparatuses and methods for material implication operations in memory. An example apparatus may include a plurality of memory cells coupled to a first access line and a plurality of second access lines, and a controller coupled to the plurality of memory cells. The controller of the example apparatus may be configured to apply a first signal to the first access line, and while the first signal is being applied to the first access line, apply a second signal to a first of the plurality of memory cells via another respective one of the plurality of second access lines and apply a third signal to a second of the plurality of memory cells via another respective one of the plurality of second access lines. The material implication operation may be performed as a result of the signals (e.g., first, second, and third signals) applied and a result of the material implication
(Continued)

operation is stored on the second of the plurality of memory cells subsequent to the application of the third signal.

20 Claims, 8 Drawing Sheets

(51) Int. Cl.
*H01L 45/00* (2006.01)
*H01L 27/24* (2006.01)

(52) U.S. Cl.
CPC ........ *G11C 13/0023* (2013.01); *G11C 13/004* (2013.01); *G11C 2213/30* (2013.01); *G11C 2213/71* (2013.01); *H01L 27/2463* (2013.01); *H01L 45/06* (2013.01); *H01L 45/08* (2013.01); *H01L 45/1233* (2013.01); *H01L 45/141* (2013.01); *H01L 45/142* (2013.01); *H01L 45/143* (2013.01); *H01L 45/144* (2013.01); *H01L 45/148* (2013.01)

(58) Field of Classification Search
CPC . G11C 13/004; G11C 2213/30; H01L 45/148; H01L 45/08; H01L 45/144; H01L 45/143; H01L 45/06; H01L 45/142; H01L 45/1233; H01L 27/2463; H01L 45/141
USPC ........................................................ 365/148
See application file for complete search history.

(56) References Cited

U.S. PATENT DOCUMENTS

| | | | |
|---|---|---|---|
| 9,312,005 B2 | 4/2016 | Castro | |
| 9,570,140 B2 | 2/2017 | Di Ventra | |
| 10,424,376 B2 * | 9/2019 | Pirovano | G11C 13/003 |
| 2008/0258129 A1 | 10/2008 | Toda | |
| 2015/0280717 A1 | 10/2015 | Sato et al. | |
| 2016/0012876 A1 | 1/2016 | Di Ventra et al. | |
| 2016/0170936 A1 | 5/2016 | Sun et al. | |
| 2017/0125097 A1 | 5/2017 | Tortorelli et al. | |
| 2017/0287558 A1 | 10/2017 | Liu et al. | |

FOREIGN PATENT DOCUMENTS

| | | |
|---|---|---|
| TW | 201643706 A | 12/2016 |
| WO | 03/085675 A2 | 10/2003 |
| WO | 2013/187193 A1 | 12/2013 |
| WO | 2014-079747 A1 | 5/2014 |
| WO | 2015/021114 A1 | 2/2015 |

OTHER PUBLICATIONS

Borghetti, et al. "Memristive' switches enable 'stateful' logic operations via material implication", Nature International Journal of Science, vol. 464, pp. 873-876, Apr. 8, 2010.
Chen, et al. "Efficient in-memory computing architecture based on crossbar arrays", IEEE International Electron Devices Meeting (IEDM), 4 pp., Dec. 7-9, 2015.
Kvatinsky "Memristor-Based Material Implication (IMPLY) Logic: Design Principles and Methodologies", IEEE Translation on Very Large Scale Integration (VLSI) Systems, vol. 22, No. 10, p. 2054-2066, Oct. 2014.
Office Action from related Taiwanese patent application No. 107145396, dated Jun. 11, 2019, 3 pages.
Notice of Preliminary Rejection from related Korean Patent Application No. 10-2020-7021510, dated Oct. 16, 2020, 14 pages.
Cheng, et al., "Reprogrammable Logic in Memristive Crossbar for In-Memory Computing", Journal of Physics D: Physics, vol. 50, Nov. 2017, 9 pages.
Notice of Rejection from related Japanese Patent Application No. 2020-535018, dated Nov. 4, 2020, 6 pages.
First Office Action from related Chinese Patent Application No. 201880083105.4, dated Dec. 7, 2020, 8 pages.

* cited by examiner

530 → 531-1  531-2  531-3
         p     q    q (pIMPq)

533-1 — 1     0     0

533-2 — 1     1     1

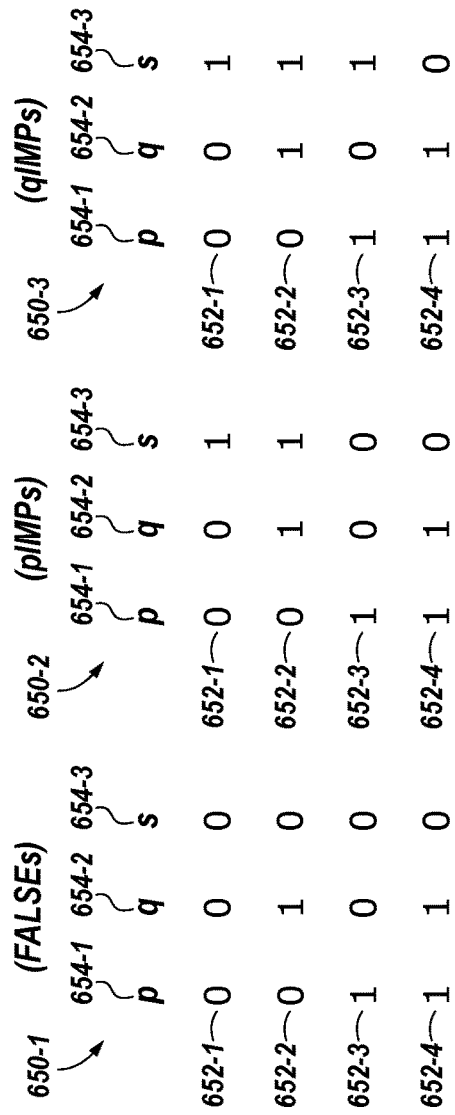
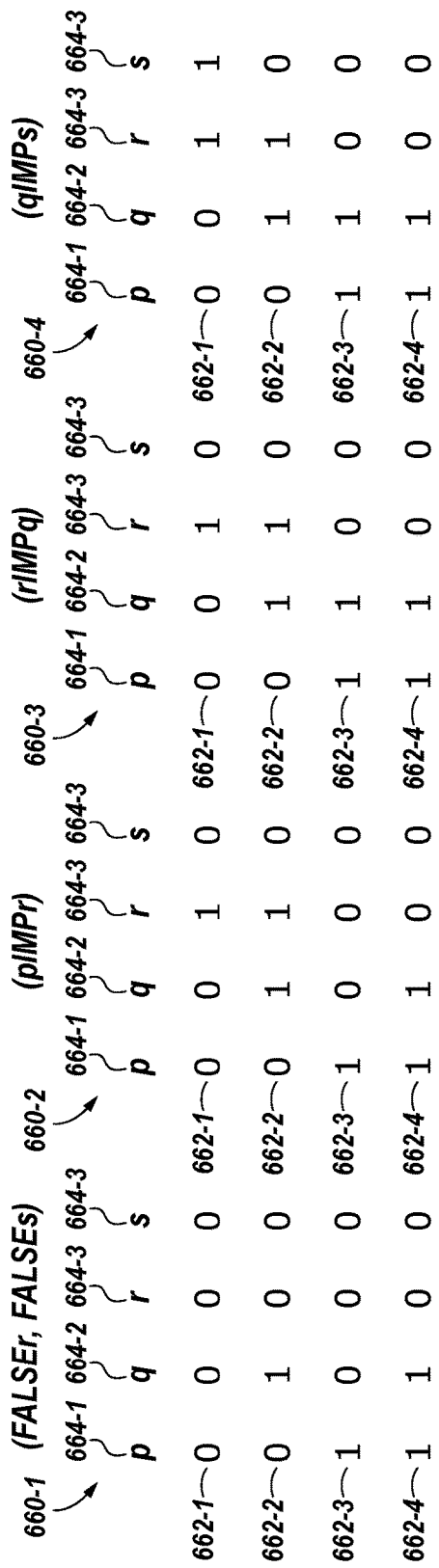
Fig. 6C
Fig. 6D

US 10,910,052 B2

MATERIAL IMPLICATION OPERATIONS IN MEMORY

PRIORITY INFORMATION

This application is a Continuation of U.S. application Ser. No. 15/853,803, filed on Dec. 24, 2017, the contents of which are incorporated herein by reference.

TECHNICAL FIELD

The present disclosure relates generally to semiconductor memory and methods, and more particularly, to material implication operations in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

Resistance variable memory such as PCRAM includes resistance variable memory cells that can store data based on the resistance of a storage element (e.g., a storage element having a variable resistance). As such, resistance variable memory cells can be programmed to store data corresponding to a target state by varying the resistance level of the resistance variable storage element. Resistance variable memory cells can be programmed to a target state (e.g., logical state) corresponding to a particular resistance, by applying sources of an electrical field or energy, such as positive or negative electrical signals (e.g., positive or negative voltage or current signals) to the cells.

Various computing architectures (e.g., Von Neumann architectures) include a bottleneck issue associated with data transfer between memory (e.g., a memory device storing data) and a processing resource (e.g., a central processing unit) used to perform compute functions on data (e.g., via logical operations such as Boolean logic operations and/or higher level mathematical operations) in association with executing instructions (e.g., a program). Some memory devices are capable of in-memory computing, which can include performing logical operations between data values stored in a memory array without transferring the data out of the array (e.g., to an external processing resource).

BRIEF DESCRIPTION OF THE DRAWINGS

FIGS. 6B-6F illustrate truth tables corresponding to in-memory logical operations that can be performed on memory cells such as those shown in FIG. 6A by performing a number of material implication operations in accordance with a number of embodiments of the present disclosure.

DETAILED DESCRIPTION

Figure 1A:
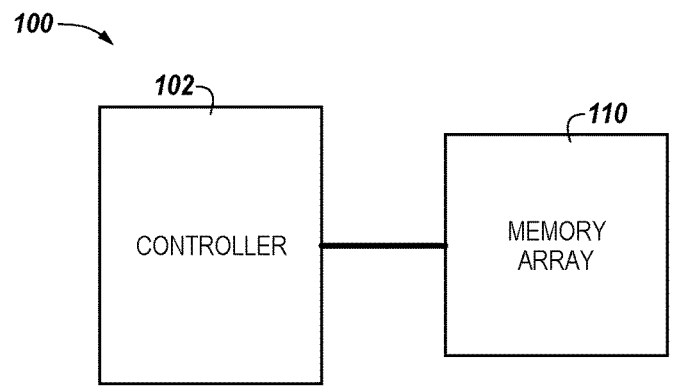
FIG. 1A illustrates a memory system capable of performing material implication operations in accordance with a number of embodiments of the present disclosure.

The present disclosure includes apparatuses and methods for material implication operations in memory. An example apparatus may include a plurality of memory cells coupled to a first access line (e.g., word line) and a plurality of second access lines (e.g., bit lines), and a controller configured to apply a first signal to the first access line, and while the first signal is being applied to the first access line, apply a second signal to a first of the plurality of memory cells via one of the plurality of second access lines and apply a third signal to a second of the plurality of memory cells via another one of the plurality of second access lines. The material implication operation may be performed as a result of the signals (e.g., first, second, and third signals) applied and a result of the material implication operation may be stored on the second of the plurality of memory cells subsequent to the application of the third signal.

Embodiments of the present disclosure provide various benefits such as reduced cost associated with a memory device capable of performing various in-memory compute operations (e.g., Boolean logical operations) compared to previous approaches. For example, the present disclosure may simplify a circuit design for a memory array that is capable of performing a material implication operation within the memory array (e.g., without transferring data associated with the material implication out of the memory array). For example, the ability to perform a material implication operation in memory along with the ability to perform a FALSE operation (e.g., an operation always resulting in logic "0") in memory form a computationally complete logic basis. As such, any Boolean logical operation (e.g., AND, OR, NAND, NOR, XOR, COPY, and/or NOT) may be derived by suitably combining performance of material implication and FALSE operations.

In-memory compute operations as described herein can be performed without having to read data values from an array into sense amplifiers, for example, which can result in consuming less power as compared to various previous approaches to in-memory computing. As described further herein, embodiments can include performing a material implication operation in memory without the use of an external load resistor such as employed by some previous in-memory computing approaches.

As used herein, a material implication operation is a valid rule of replacement that allows for a conditional statement to be replaced by a disjunction (e.g., OR), in which the antecedent is negated (e.g., NOT). For example, the operation may state that "p" implies "q" (e.g., in which "p" is an antecedent and "q" is a consequent) is logically equivalent to (not-p) OR q. As used herein, a material implication operation may be represented as "IMP". For example, performing a material implication operation on an antecedent "p" and a consequent "q" may be represented as pIMPq.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of" something (e.g., a number of memory cells) can refer to one or more of such things, whereas a "plurality of" is intended to refer to more than one of such things (e.g., more than one memory cell). Furthermore, the words "can" and "may" are used throughout this application in a permissive sense (e.g., having the potential to, being able to), not in a mandatory sense (e.g., required to).

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 314 in FIG. 3.

FIG. 1A illustrates a memory system 100 capable of performing material implication operations in accordance with a number of embodiments of the present disclosure. As shown in FIG. 1A, the memory system 100 includes a controller 102 and a memory array 110.

The controller 102 can communicate with the memory array 110 to perform memory operations such as read, write, and/or erase operations, and logical operations (e.g., Boolean operations including IMP, NAND, NOR, XOR, COPY, NOT, AND, and/or OR, among other operations). As an example, the controller 102 can be on a same die or a different die than a die or dice corresponding to the memory array 110. The controller 102 can include, for example, a number of components in the form of hardware and/or firmware (e.g., one or more integrated circuits) and/or software for controlling access to the memory array 110 and/or for facilitating data transfer between the memory array 110 and a requesting device (e.g., host, not shown, but which may be coupled to the memory system 100).

The controller 102 is capable of providing signals to array 110 to perform memory operations such as reads and writes. In a number of examples, the controller 102 may be configured to provide signals to the array 110 to perform in-memory compute operations such as material implication operations and/or other Boolean logic operations as described further herein.

The memory array 110 may serve as a memory for the memory system 100. The memory array 110 may include memory cells that are resistance variable memory cells. For example, states (e.g., logical states) of the memory cells may be determined based on resistance (e.g., corresponding voltages) of the memory cells that are variable responsive to voltages applied across the memory cells. As described further herein, the memory cells of the memory array 110 may be capable of storing a value corresponding to an antecedent, a value corresponding to a consequent, and a value corresponding to a result of a material implication operation, which may be performed within the memory array 110.

Figure 1B:
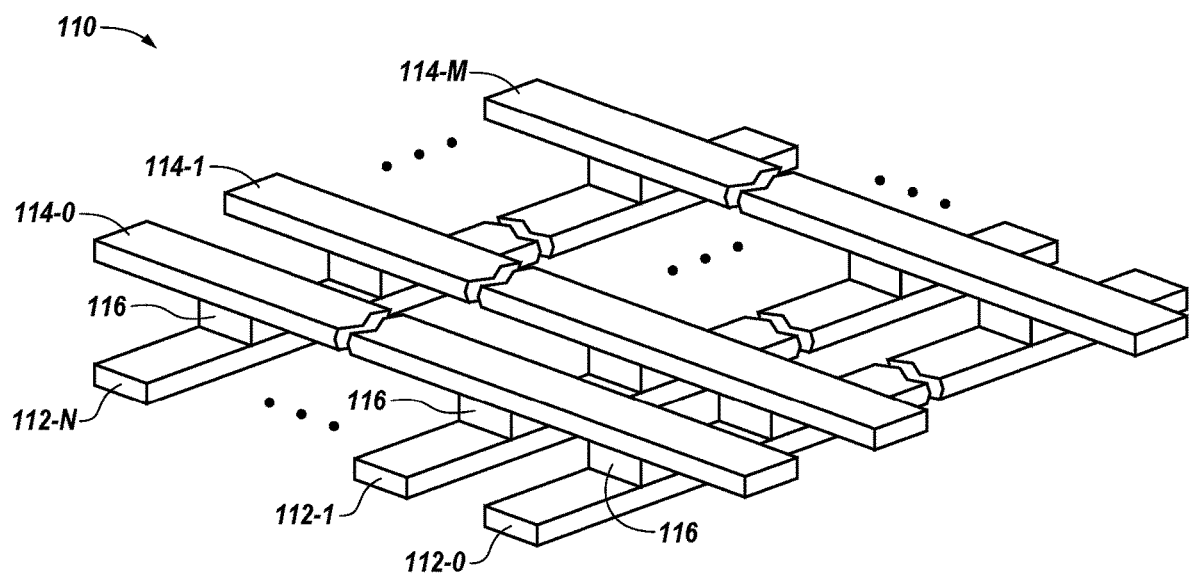
FIG. 1B illustrates an example of a memory array capable of storing data values on which material implication operations can be performed in accordance with a number of embodiments of the present disclosure.

FIG. 1B illustrates an example of a memory array 110 capable of storing data values on which material implication operations can be performed in accordance with a number of embodiments of the present disclosure. The example shown in FIG. 1B is a cross-point memory array; however, embodiments are not so limited. Memory array 110 includes a plurality of access lines 112-0 to 112-N (e.g., which may be referred to as word lines 112), and a plurality other access lines 114-0 to 114-M (e.g., which may be referred to as bit lines 114) that cross each other (e.g., intersect in different planes). Memory cells 116 are located at intersections of the word lines 112 and the bit lines 114 (e.g., at each bit line/word line crossing). Although in FIG. 1B, the access lines 112 are word lines and the access lines 114 are bit lines, in a number of embodiments, the access lines 112 may be bit lines and the access lines 114 may be word lines.

The memory cells 116, for example, can be non-volatile resistance variable memory cells each having an associated select element and a storage element. The select elements in each resistance variable memory cells can be operated (e.g., turned on/off) to select the memory cells in order to perform operations such as data programming and/or data reading operations on the resistance variable memory cells.

Although the array 110 is shown as a two-dimensional (2D) arrangement, in various embodiments, the array 110 may also be a three-dimensional (3D) cross-point array, which might comprise multiple tiers of array 110 stacked (e.g., vertically) on each other.

As used herein, a storage element refers to a programmable portion of a resistance variable memory cell. For example, in PCRAM and RRAM cells, a storage element can include the portion of the memory cell having a resistance that is programmable to data states responsive to applied programming signals (e.g., voltage and/or current pulses), for example. The storage element can include a resistance variable material such as a phase change material (e.g., phase change chalcogenide alloy) such as an indium (In)-antimony(Sb)-tellurium(Te) (IST) material, e.g., $In_2Sb_2Te_5$, $In_1Sb_2Te_4$, $In_1Sb_4Te_7$, etc., or a germanium-antimony-tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

The select element can also be a chalcogenide material such as those described above. While the select element and the storage element can comprise different chalcogenide materials, embodiments are not so limited. For example, each cell can comprise a material (e.g., a chalcogenide material) that can serve as both the storage element and the select element, with the cells being referred to as SSM (Self-Select Memory) cells. Example threshold voltage (Vt) distributions and current-versus-voltage signatures for SSM cells are described further below (e.g., in association with FIGS. 2A and 2B).

Figure 2A:
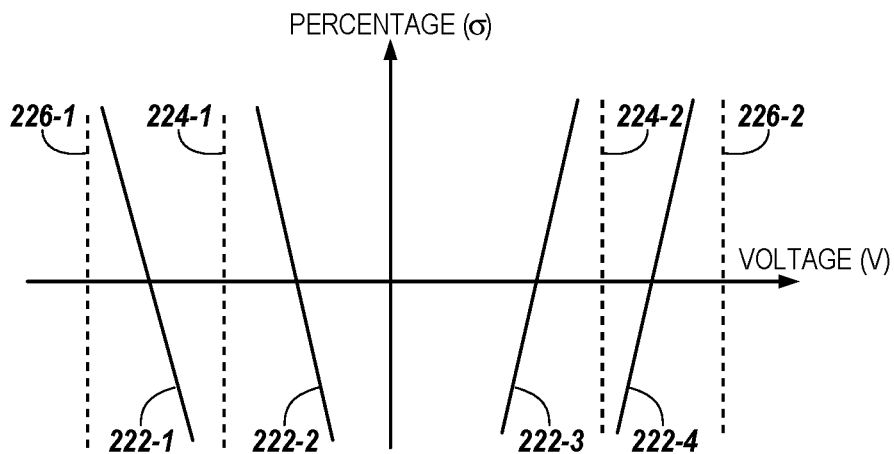
FIG. 2A illustrates threshold voltage distributions associated with states of memory cells on which material implication operations can be performed in accordance with a number of embodiments of the present disclosure.

FIG. 2A illustrates threshold voltage distributions associated with states of memory cells on which material implication operations can be performed in accordance with a number of embodiments of the present disclosure. In this example, the memory cells are SSM cells with the voltage distributions 222-1, 222-2, 222-3, and 222-4 corresponding to respective threshold voltage states, which may be referred to collectively as distributions 222 or states 222. The distributions 222 represent a statistical variation in the voltages of memory cells programmed to a particular state (e.g., logical state). As described further herein, the voltage distributions 222 may correspond to programmed states achieved via particular voltage differentials applied to (e.g., across) the memory cells (e.g., via applied voltage differentials between word lines such as word lines 112 and bit lines such as bit lines 114). As used herein, a voltage differential applied across a memory cell may be referred to as a memory cell voltage ($V_{CELL}$) such as the difference between a word line voltage (e.g., voltage applied to a memory via one of the access lines 112) and a bit line voltage (e.g., voltage applied to the memory cell via corresponding one of the access lines 114).

FIG. 2A shows four different voltage distributions 222-1, 222-2, 222-3, and 222-4, which may represent four different states of memory cells. For example, although embodiments are not so limited, a voltage distribution 222-1 may represent a set state (e.g., "1"), a voltage distribution 222-2 may represent a reset state (e.g., "0"), a voltage distribution 222-3 may represent a set state (e.g., "1"), and a voltage distribution 222-4 may represent a reset state (e.g., "0").

FIG. 2A shows two different read voltages 224-1 and 224-2 used to distinguish cell states (e.g., logical states). For example, read voltage 224-1 can be used to determine whether a cell is programmed to state 222-1 or 222-2, and read voltage 224-2 can be used to determine whether a cell is programmed to state 222-3 or 222-4. As shown in FIG. 2A, an absolute value (e.g., magnitude) of each voltage 224-1 and 224-2 may be higher than one of the respective voltage distributions and lower than another one of the respective voltage distributions. For example, the magnitude of the voltage 224-1 may be higher than the voltage distribution 222-2 (e.g., representative of a reset state"0") and lower than the voltage distribution 222-1 (e.g., representative of a set state "1"). For example, the magnitude of the voltage 224-2 may be higher than the voltage distribution 222-3 (e.g., representative of a set state"1") and lower than the voltage distribution 222-4 (e.g., representative of a reset state "0").

The voltages 224 may be utilized to distinguish those memory cells in one state (e.g., set state) corresponding to the voltage distribution 222-1 from memory cells in another state (e.g., reset state) corresponding to the voltage distribution 222-2. For example, a voltage 224-2 may be utilized to distinguish those memory cells in one state (e.g., set state) corresponding to the voltage distribution 222-3 from memory cells in another state (e.g., reset state) corresponding to the voltage distribution 222-4. Logical states (e.g., set and reset states) of memory cells may be determined based on $V_{CELL}$ the memory cells exhibit subsequent to applying the voltages 224, which is further described in connection with FIG. 2B and FIG. 2C. As used herein, the voltages 224 may be referred to as read voltages (e.g., $V_{READ}$), which correspond to voltage differentials applied across memory cells to determine their logic state during a read operation.

As shown in FIG. 2A, the read voltages 224-1 and 224-2 have different polarities. In this example, the voltage 224-1 is a negative voltage and the voltage 224-2 is a positive voltage. As used herein, the polarity of a voltage can be based on a word line versus bit line differential (e.g., whether a bit line voltage is greater or less than a word line voltage).

Memory cells (e.g., memory cells 116) may be read using a read voltage having the same polarity as that of the Vt of the memory cells. For example, a memory cell having a negative Vt (e.g., corresponding to the voltage distributions 222-1 and 222-2) may be read using the voltage 224-1 having a negative polarity, and a memory cell having a positive Vt (e.g., corresponding to the voltage distributions 222-3 and 222-4) may be read using the voltage 224-2 having a positive polarity. However, embodiments are not so limited. For example, in performing a material implication operation, a read voltage having a positive polarity may be applied to a memory cell regardless of a state (e.g., logical state) of the memory cell. The positive read voltage may be used (e.g., applied across) to read a memory cell that may have a negative Vt. (e.g., programmed to a set state "1" by applying a voltage 226-1).

The memory cells (e.g., memory cells 116) that are read via the read voltages 224 having the same polarity as the memory cell Vts may exhibit, when read, the same voltage to which the memory cells are previously programmed independent of the number of times those are read. For example, the read is a non-destructive read (e.g., the logic state of the cell is maintained even if the magnitude of the read voltage 224 exceeds a Vt of the memory cell being read). In a number of embodiments, a FALSE operation may be performed as a result of programming the memory cells to a reset state (e.g., "0" by applying the program voltage 226-2). For example, regardless of input of the FALSE operation, an output (e.g., values stored on the memory cells programmed to a reset state) may be "0", which indicates FALSE.

FIG. 2A shows two different voltages 226-1 that may be utilized to program memory cells to a particular logical state (e.g., "0" or "1"). For example, a memory cell may be programmed to a set state (e.g., "1") by applying a voltage 226-2 and to a reset state (e.g., "0") by applying a voltage 226-1 across the memory cell. As used herein, the voltages 226 may be referred to as program voltages and applying the voltages 226 to program memory cells to particular logical states may be referred to as a program operation.

The voltage 226-1 may have a different polarity as the polarity of the voltage 226-2. For example, as shown in FIG. 2A, the voltage 226-1 may have a negative polarity and the voltage 226-2 may have a positive polarity. Memory cells may be programmed to a set state (e.g., "1") by applying voltage 226-2 having a positive polarity and to a reset state (e.g., "0") by applying voltage 226-1 having a negative polarity.

Figure 2B:
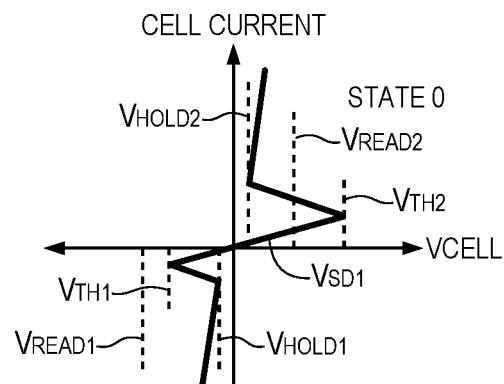
FIGS. 2B-2C are graphs illustrating current-versus-voltage signatures associated with memory cells on which material implication operations can be performed in accordance with a number of embodiments of the present disclosure.
Figure 2C:
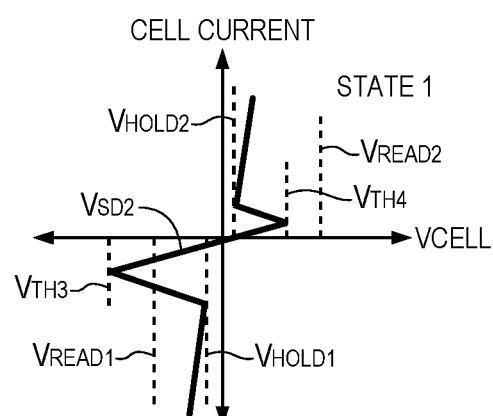

FIGS. 2B-2C are graphs illustrating current-versus-voltage signatures associated with memory cells on which material implication operations can be performed in accordance with a number of embodiments of the present disclosure. $V_{CELL}$, as illustrated in FIGS. 2B and 2C, may represent the voltage differential (e.g., a difference between a bit line voltage and a word line voltage) as described in connection with FIG. 2A. Cell current, as illustrated in FIG. 2B, may represent a current flowing through a memory cell when a corresponding voltage is applied across the memory cell.

FIG. 2B shows a current-versus-voltage graph of a memory cell programmed to a reset state (e.g., "0"). A memory cell having a positive polarity Vt may be in a non-conductive state (e.g., higher resistance) until $V_{CELL}$ reaches threshold voltage ($V_{TH2}$), at which point the memory cell switches (e.g., transitions via a "snapback" event) to a conductive state (e.g., lower resistance). As used herein, those different resistance may be referred to as resistance states (e.g., either conductive or non-conductive state). As such, when the positive voltage applied across the memory cell exceeds the threshold voltage ($V_{TH2}$), the memory cell switches to a conductive state from a non-conductive state. Subsequent to switching from a non-conductive state to a conductive state, $V_{CELL}$ may remain at a hold voltage ($V_{HOLD2}$), which is lower than the threshold voltage ($V_{TH2}$). Similarly, when a negative voltage, whose absolute value (e.g., magnitude) exceeds an absolute value of the threshold voltage ($V_{TH1}$), is applied across the memory cell, the cell switches from a non-conductive state to a conductive state and remains at a hold voltage ($V_{HOLD1}$).

FIG. 2C shows a current-versus-voltage graph of a memory cell programmed to a set state (e.g., "1"). A memory cell having a negative polarity Vt, may be in a non-conductive state (e.g., higher resistance) until $V_{CELL}$ reaches threshold voltage ($V_{TH3}$), at which point the memory cell switches to a conductive state. As such, when the negative voltage (e.g., applied across the memory cell) whose absolute value exceeds the threshold voltage ($V_{TH3}$), the memory cell switches to a conductive state from a non-conductive state. Subsequent to switching from a non-conductive state to a conductive state, $V_{CELL}$ may remain at a $V_{HOLD1}$, which is lower than the threshold voltage ($V_{TH3}$). Similarly, when the positive voltage (e.g., applied across the memory cell) whose absolute value exceeds an absolute value of the threshold voltage ($V_{TH4}$), the memory cell switches from a non-conductive state to a conductive state and remains at a $V_{HOLD2}$.

In a number of embodiments, the memory cells (e.g., SSM) of the present disclosure may have particular switching characteristics. As an example, the magnitudes of the threshold voltages of a memory cell (e.g., one of the memory cells 116) in a particular state may be asymmetric for different polarities, as shown in FIGS. 2B and 2C. For example, a magnitude of the threshold voltage $V_{TH1}$ may be lower than that of the threshold voltage $V_{TH3}$, and a magnitude of the threshold voltage $V_{TH4}$ may be lower than that of the threshold voltage $V_{TH2}$.

As such, in some embodiments, a read voltage (e.g., read voltages 224) applied to a memory cell Vt having a magnitude greater than a corresponding threshold voltage may switch a resistance state (e.g., from a non-conductive state to a conductive state) of the memory cell. For example, the read voltage 224-2 ($V_{READ2}$), when applied, may switch a memory cell (e.g., programmed to a logical state "1" as shown in FIG. 2C) from a non-conductive state to a conductive state because the memory cell has a threshold voltage $V_{TH4}$ lower than $V_{READ2}$. For example, the read voltage 224-1 ($V_{READ1}$), when applied, may switch a memory cell (e.g., programmed to a logical state "0" as shown in FIG. 2B) from a non-conductive state to a conductive state because the memory cell has a threshold voltage $V_{TH1}$ (e.g., whose absolute value is) lower than $V_{READ1}$.

Logical states of memory cells whose states are changed from a non-conductive state to a conductive state due to an application of read voltage (e.g., $V_{READ1}$ and $V_{READ2}$) may not be changed in some circumstances. As described in connection with FIG. 2A, a logical state of memory cell may be determined based on whether $V_{CELL}$ (e.g., subsequent to applying a corresponding read voltage $V_{READ1}$ and $V_{READ2}$) is (e.g., substantially) equal to $V_{HOLD}$ or greater than the applied read voltages $V_{READ1}$ and $V_{READ2}$.

For example, as shown in FIG. 2B, a memory cell programmed to a reset state "0" may be switched to a conductive state from a non-conductive state subsequent to $V_{READ1}$ (e.g., that is greater than $V_{TH1}$) applied to the memory cell such that the switched memory cell exhibits $V_{HOLD1}$, as shown in FIG. 2B. As such, responsive to detecting $V_{HOLD1}$ across the switched memory cell (e.g., $V_{CELL}$), a logical state of the memory cell may still be determined to be a reset state "0" (e.g., represented by the voltage distribution 222-2). In contrast, the same memory cell (e.g., programmed to a reset state "0" as shown in FIG. 2B) may not be switched to a conductive state from a non-conductive state subsequent to $V_{READ2}$ applied to the memory cell. This is because the threshold voltage $V_{TH2}$ is greater than $V_{READ2}$, as shown in FIG. 2B. As such, the memory cell, as shown in FIG. 2B, may still exhibits sub-threshold voltage ($V_{SD1}$) whose magnitude is greater than $V_{READ2}$, as shown in FIG. 2B.

For example, as shown in FIG. 2C, a memory cell programmed to a set state "1" may be switched to a conductive state from a non-conductive state subsequent to $V_{READ2}$ (e.g., that is greater than $V_{TH4}$) applied to the memory cell such that the switched memory cell exhibits $V_{HOLD2}$. As such, responsive to detecting $V_{HOLD2}$ across the switched memory cell (e.g., $V_{CELL}$), a logical state of the memory cell may still be determined to be a set state "1" (e.g., represented by the voltage distribution 222-3). In contrast, the same memory cell (e.g., programmed to a set state "1" as shown in FIG. 2C) may not be switched to a conductive state from a non-conductive state subsequent to $V_{READ1}$ applied to the memory cell. This is because the threshold voltage $V_{TH3}$ is greater than $V_{READ1}$, as shown in FIG. 2B. As such, the memory cell, as shown in FIG. 2B, may still exhibits sub-threshold voltage ($V_{SD2}$) whose magnitude is greater than $V_{READ1}$, as shown in FIG. 2B.

Those characteristics of memory cells such as SSM cells can be exploited to perform material implication operations in accordance with embodiments described herein. For example, performing material implication operations may involve applying a positive read voltage (e.g., $V_{READ2}$) on one memory cell. Applied $V_{READ2}$ may switch a memory cell (e.g., from a non-conductive state to a conductive state) only when the memory cell is programmed to a set state (e.g., as shown in FIG. 2C) while not affecting a logical state of the memory cell regardless its previous logical state (e.g., as shown in FIGS. 2B and 2C). The switched memory cell may affect a word line to which the switched memory cell is coupled, and the affected word line may program, as a result of subsequent signals applied, another memory cell (e.g., coupled to the same word line) to a set state "1" regardless of a previous state of the another memory cell.

Figure 3:
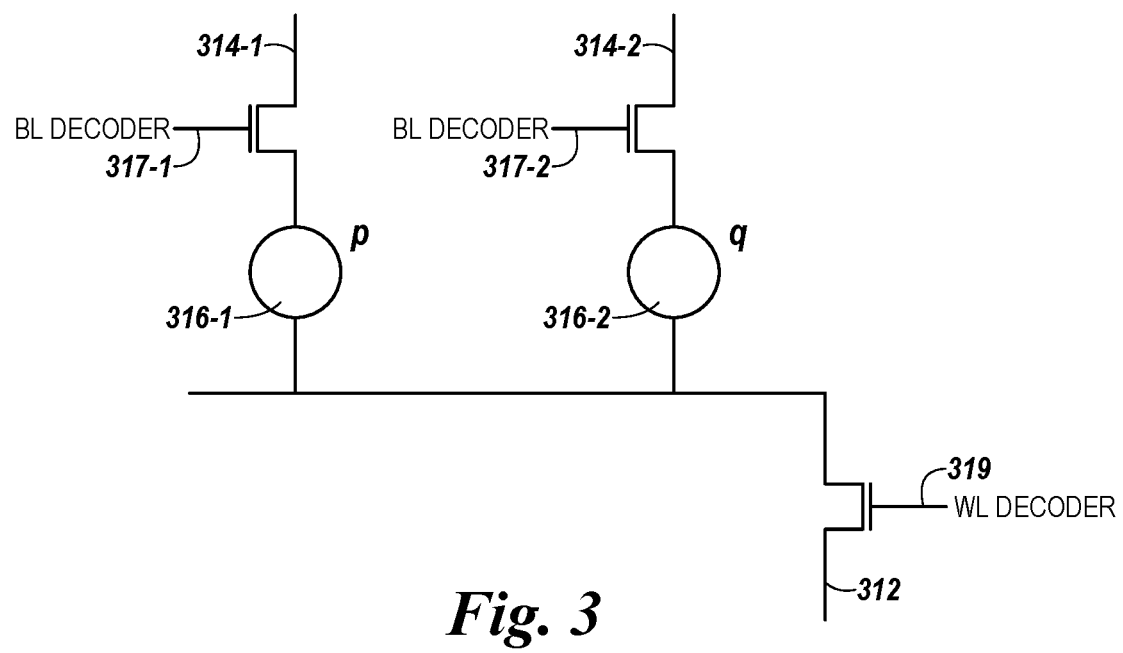
FIG. 3 is a diagram illustrating a portion of a memory array including memory cells capable of storing values associated with a material implication operation in accordance with a number of embodiments of the present disclosure.

FIG. 3 is a diagram illustrating a portion of a memory array 310 including memory cells 316 capable of storing values associated with a material implication operation in accordance with a number of embodiments of the present disclosure. As illustrated in FIG. 3, memory cells 316-1 and 316-2 (e.g., collectively referred to as memory cells 316) may be coupled to bit lines 314-1 and 314-2 (e.g., collective referred to as bit lines 314), respectively, and to a word line 312. The memory cells 316 may be read and programmed using voltages such as those described in connection with FIGS. 2A-2C.

The bit lines 314 may be utilized for applying respective bit line voltages. For example, a bit line voltage may be applied to the memory cell 316-1 via the bit line 314-1, and another bit line voltage may be applied to the memory cell 316-2 via the bit line 314-2. As such, a bit line voltage for each of the memory cells 316 may be individually controlled (e.g., applying the bit line voltage of the bit line 314-1 may not affect the bit line voltage of the bit line 314-2).

The word line 312 may be utilized for applying a word line voltage. For example, a word line voltage may be applied to the memory cells 316-1 and 316-2 via the same word line 312. Memory array 310 that lacks an external resistor (e.g., load resistor) may be utilized for controlling respective word line voltages of the memory cells 316 at once (e.g., in contrast to controlling each word line voltage at a time).

As shown in FIG. 3, the memory cells 316-1 and 316-2 may be coupled to bit line decoders 317-1 and 317-2, respectively, and to a word line decoder 319. The bit line decoders 317 and the word line decoder 319 may be capable of receiving and decoding address signals to provide accessing the memory array 310. Although not shown in FIG. 3, the decoders 317 and 319 may include drivers (e.g., bit line drivers and/or word line drivers).

As described in connection with FIG. 2, each of the memory cells 316 may switch (e.g., transition) between a non-conductive state and a conductive state. When a memory cell (e.g., one of the memory cells 316) switches from a non-conductive state to a conductive state, a word line voltage may be raised, which would result in lowering $V_{CELL}$ than it would have been had the memory cell not been switched. For example, $V_{CELL}$ may become and remain at $V_{HOLD}$ (e.g., as shown in FIG. 2) when the memory cell switches from a non-conductive state to a conductive state.

In some approaches, memory cells may be coupled to a number of load resistors, and the number of load resistors may limit an impact of the raised word line voltage only to a corresponding memory cell. For example, although the memory cells are coupled to the same word line, corresponding word line voltages of other of the memory cells may not be affected (e.g., raised) even when one of the memory cells switches from a non-conductive state to a conductive state, which results in raising a corresponding word line voltage. Therefore, programming memory cells of a memory array having load resistors may be time-consuming since a respective word line voltage for each memory cell needs to be controlled individually, which may not suitable for performing material implication operations.

In contrast, the memory array 310 may not include an external resistor (e.g., load resistor) among the memory cells 316. As used herein, the load resistor may be referred to as a resistor external to memory cells and used solely for power consumption without generating signals. For example, the memory cells 316 may be directly coupled to a word line decoder 319 that may generate signals associated with decoding address signals as opposed to a load resistor, which lacks a signal source (e.g., and/or power source). Such a structure may be utilized in performing a material implication operation, which may reduce performance time associated with controlling access line voltages (e.g., word line voltages). Details of how to utilize the memory array 310 in performing a material implication operation are further described in connection with FIGS. 4 and 5.

Figures 4A, 4B:
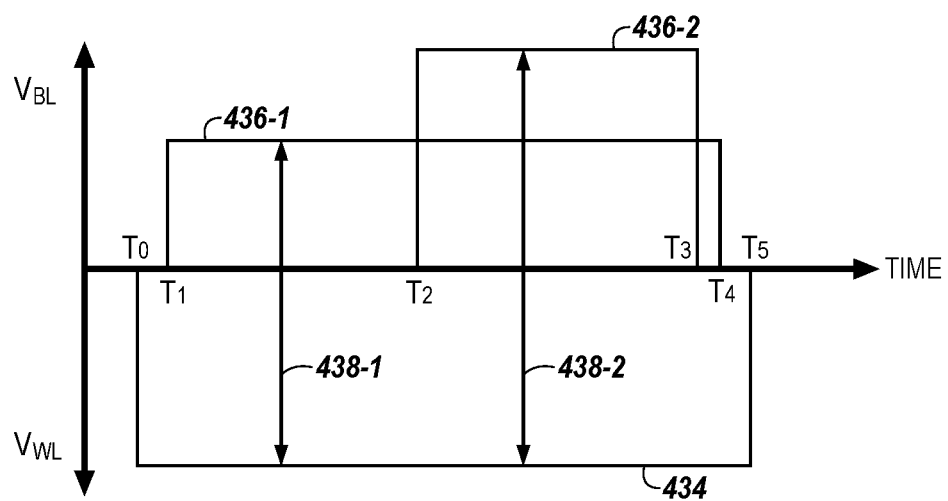
FIG. 4A illustrates a portion of a truth table associated with performing a material implication operation using the applied signals shown in FIG. 4B.
FIG. 4B illustrates a number of signals applied to memory cells in association with performing a material implication operation in accordance with a number of embodiments of the present disclosure.

FIG. 4A illustrates a portion of a truth table 430 associated with performing a material implication operation using the applied signals shown in FIG. 4B. FIG. 4B illustrates a number of signals 434, 436 applied to memory cells in association with performing a material implication operation in accordance with a number of embodiments of the present disclosure.

Performing a material implication operation may include applying a plurality of signals (e.g., signals 434 and 436) in a particular sequence. In a number of embodiments, a signal may be a squared pulse having a particular polarity and magnitude. As used herein, a squared pulse may be referred to as a pulse whose transitions from one value to another value is substantially instantaneous, as shown in FIG. 4B.

Each of the plurality of signals 434 and 436 may correspond to a voltage to be applied to a respective access line. For example, a signal 434 may correspond to a voltage that may be applied to a word line to which the memory cells "p" and "q" are coupled. For example, a signal 436-1 may correspond to a voltage applied to the bit line to which memory cell "p" is coupled. For example, a signal 436-2 may correspond to a voltage that may be applied to the bit line to which memory cell "q" is coupled. As such, the signal 434 may be referred to as a word line voltage $V_{WL}$ and each of the signals 436 may be referred to as a bit line voltage $V_{BL}$.

Table 430 shows states of memory cell "p" and memory cell "q" as a result of applying the plurality of signals 434 and 436. For example, columns 431-1 and 431-2 (e.g., of table 430) show states of memory cell "p" and memory cell "q," respectively, prior to applying the plurality of signals 434 and 436. For example, a column 431-3 (e.g., of table 430) shows states of memory cell "q" (e.g., shown as q (pIMPq)) subsequent to applying the plurality of signals 434 and 436.

FIG. 4A-4B assumes (e.g., as shown by column 431-1) that the memory cell "p" is programmed to a reset state (e.g., "0") prior to applying the plurality of signals 434 and 436. The plurality of signals 434 and 436 may be applied in a particular sequence. For example, the signal 434 may be applied for a particular period of time (e.g., $T_0$ to $T_5$), the signal 436-1 may be applied for a particular period of time (e.g., $T_1$ to $T_4$) that is within the period of time for which the signal 434 is being applied, and the signal 436-2 may be applied for a particular period of time (e.g., $T_2$ to $T_3$) that is within the period of time for which the signal 436-1 is being applied.

As shown in FIG. 4B, a voltage corresponding to the signal 436-1 may be less than a voltage corresponding to the signal 436-2. As such, assuming that the word line voltage remains the same from $T_0$ to $T_5$, a voltage differential 438-1 applied across the memory cell "p" at $T_1$ (e.g., until $T_4$) may be less than a voltage differential 438-2 applied across the memory cell "q" at $T_2$ (e.g., until $T_3$). A magnitude of the voltage 438-1 may be equal to (e.g., absolute value of) the read voltage 224 or greater, and a magnitude of the voltage 438-2 may be equal to the program voltage 226 or greater.

When the memory cell "p" is programmed to a reset state (e.g., "0"), the voltage differential 438-1 applied across the memory cell "p" at $T_1$ may not be sufficient to switch (e.g., from a non-conductive state to a conductive state) the memory cell "p" because the memory cell "p" has a threshold voltage (e.g., $V_{TH2}$, as illustrated in FIG. 2B) that is higher than a read voltage (e.g., $V_{READ2}$, as illustrated in FIG. 2B). As such, the voltage applied across the memory cell "p" at $T_1$ does not affect the word line voltage 434.

When the word line voltage 434 remains the same from $T_0$ to $T_5$, a voltage differential 438-2 applied across the memory cell "q" at $T_3$ may be sufficient to switch the memory cell q, which would result in programming the memory cell "q" to a set state (e.g., "1"). For example, the memory cell q previously programmed to a reset state (e.g., "0") represented by the voltage distribution 222-2 may be programmed to a set state (e.g., "1") represented by the voltage distribution 222-3. For example, the memory cell q previously programmed to a set state (e.g., "1") represented by the voltage distribution 222-3 may be switched to a conductive state again, which indicates the same state (e.g., represented by the voltage distribution 222-3). Therefore, regardless of a previous state of the memory cell q, the memory cell "q" is programmed to a set state (e.g., "1") as a result of applying the plurality of signals 434 and 436, as shown in the table 430.

Figures 5A, 5B:
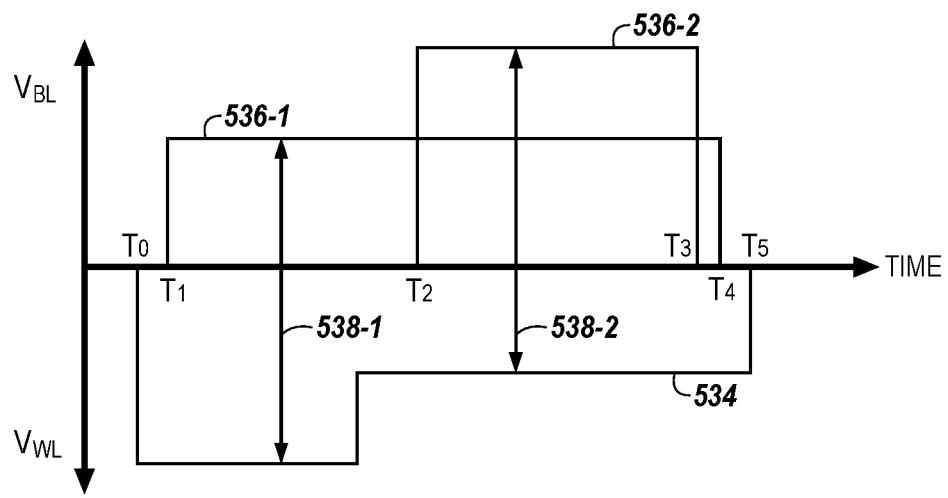
FIG. 5A illustrates a portion of a truth table associated with performing a material implication operation using the applied signals shown in FIG. 5B.
FIG. 5B illustrates a number of signals applied to memory cells in association with performing a material implication operation in accordance with a number of embodiments of the present disclosure.

FIG. 5A illustrates a portion of a truth table 530 associated with performing a material implication operation using the applied signals shown in FIG. 5B. FIG. 5B illustrates a number of signals 534, 536 applied to memory cells in association with performing a material implication operation in accordance with a number of embodiments of the present disclosure.

Signals 534, 536-1 and 536-2 may be analogous to signals 434, 436-1, and 436-2, respectively, as described in connection with FIG. 4B. For example, a signal 534 may correspond to a voltage that may be applied to a word line (e.g., word line 312) to which the memory cells 316 may be coupled. For example, a signal 536-1 may correspond to a voltage that may be applied to one of bit lines to which one memory cell "p" may be coupled. For example, a signal 536-2 may correspond to a voltage that may be applied to another one of the bit lines to which memory cell "q" may be coupled.

Table 530 shows states of memory cell "p" and memory cell "q" as a result of applying the plurality of signals 534 and 536. For example, columns 531-1 and 531-2 (e.g., of table 530) show states of memory cell "p" and memory cell "q," respectively, prior to applying the plurality of signals 534 and 536. For example, a column 531-3 (e.g., of table 530) shows states of memory cell "q" (e.g., shown as q (pIMPq)) subsequent to applying the plurality of signals 534 and 536.

FIG. 5A-5B assumes that the memory cell "p" is programmed to a set state (e.g., "1") prior to applying the plurality of signals 534 and 536. The plurality of signals 534 and 536 may be applied in a particular sequence, as described in connection with FIG. 4B and shown in FIG. 5B. For example, the signal 534 may be applied (e.g., to a word line to which the memory cells "p" and "q" are coupled) from $T_0$ to $T_5$; the signal 536-1 may be applied (e.g., to a bit line to which the memory cell "p" is coupled) from $T_1$ to $T_4$ (e.g., while the signal 534 is being applied), and the signal 536-2 may be applied (e.g., to a bit line to which the memory cell "q" is coupled) from $T_2$ to $T_3$ (e.g., while the signal 536-1 is being applied).

As shown in FIG. 5B, a voltage differential 538-1 may not be less than a voltage differential 538-2. Unlike the scenario described in connection with FIG. 4A-4B (e.g., in which the memory cell "p" is previously programmed to a reset state (e.g., "0")), the memory cell "p" that is programmed to a set state (e.g., "1") has a threshold voltage that is less than a read voltage. For example, the voltage differential 538-1 applied across the memory cell "p" is sufficient to switch the memory cell "p" to a different state (e.g., non-conductive state to a conductive state), as described in connection with FIG. 2B and FIG. 2C. As such, at some point subsequent to $T_1$, the word line voltage ($V_{WORD}$) is raised due to the switching event of the memory cell p. The raised $V_{WORD}$ may reduce the voltage differential 538-2 (e.g., voltage applied across the memory cell "q" at $T_3$). For example, even if the bit line voltage 564-2 (e.g., applied on the memory cell "q") may be the same voltage as the bit line voltage 464-2, the voltage differential voltage 538-2 across the memory cell "q" from $T_3$ to $T_4$ may be reduced since $V_{WORD}$ is raised. The voltage differential 538-2 reduced compared to the voltage differential 438-1 may correspond to a magnitude of the read voltages 224.

The reduced voltage differential 538-2 may not change a logical state of the memory cell "q". For example, when the memory cell "q" is previously programmed to a reset state (e.g., represented by the voltage distribution 222-4), a threshold voltage (e.g., $V_{TH2}$) of the memory cell "q" is greater than the reduced voltage differential 538-2 (e.g., $V_{READ2}$), and the memory cell "q" may remain in the same state (e.g., reset state). For example, when the memory cell "q" is previously programmed to a set state (e.g., represented by the voltage distribution 222-1), a threshold voltage (e.g., $V_{TH4}$) of the memory cell "q" is less than the reduced voltage differential 538-2, and the reduced voltage differential 538-2 may switch the memory cell "q" from a non-conductive state to a conductive state (e.g., 222-3) again, which indicates the same state (e.g., a set state "1").

As shown in FIGS. 4A and 5A, as a result of applying of the plurality of signals (e.g., 434 and 436 and/or 534 and 536) a state of the memory cell "q" may be changed (e.g., from a reset state "0" to a set state "1") only when the memory cell "p" has been programmed to a reset state.

Given that a value stored (e.g., as show in column 531-1) on the memory cell "p" is an antecedent and a value stored (e.g., as shown in column 531-2) on the memory cell "q" is a consequent (e.g., of the material implication operation), a resulting state of the memory cell "q" (e.g., as shown in column 531-3) corresponds to a result of the material implication operation. Stated differently, applying the plurality of signals in the particular sequence, as illustrated herein, on a memory array (e.g., memory array 310) may result in performing a material implication operation whose result may be stored on one of memory cells (e.g., memory cell "q") whose previous stored value has been used as a consequent. Similarly, by performing a number of material implication operations, a memory array (e.g., memory array 110) may be configured to perform Boolean logical operations such as NOT, NAND, NOR, COPY, and/or XOR, among others.

In a number of embodiments, material implication operations may be performed without transferring values associated with the material implication operations from a memory array (e.g., memory array 110). For example, the material implication operations may be performed without reading and/or storing those values such as antecedent and/or consequent in a different storage location (e.g., sense amplifier, latch, etc.). As such, embodiments of the present disclosure provide benefits such as reducing power consumption as compared to previous approaches which may involve transferring operands of material implication operations to sensing circuitry (e.g., during read operations).

Figure 6A:
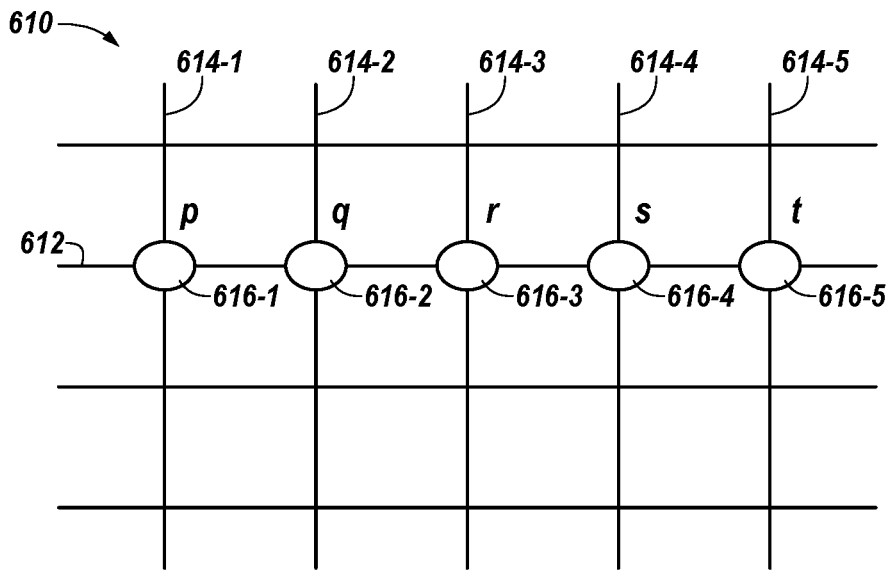
FIG. 6A illustrates a portion of a memory array that can be operated to perform material implication operations in accordance with a number of embodiments of the present disclosure

FIG. 6A illustrates a portion of a memory array 610 that can be operated to perform material implication operations in accordance with a number of embodiments of the present disclosure (e.g., such as those described in association with FIGS. 6B-6F). For example, tables 640, 650, 660, 670, and 680 illustrate performing respective logical operations (e.g., NOT, NAND, NOR, COPY, and/or XOR) by performing a material implication operation or a plurality of (e.g., combination of) material implication operations.

As shown in FIG. 6A, memory array 610 may include memory cells 616-1, 616-2, 616-3, 616-4, and 616-5 (e.g., collectively referred to as memory cells 616) that are commonly coupled to a same word line 612 and to respective bit lines 614-1, 614-2, 614-3, 614-4, and 614-5.

In this example, the memory cell "p" (e.g., 616-1) is coupled to t bit line 614-1, the memory cell "q" (e.g., 616-2) is coupled to bit line 614-2, the memory cell "r" (e.g., 616-3) is coupled to bit line 614-3, the memory cell "s" (e.g., 616-4) is coupled to bit line 614-4, and the memory cell "t" (e.g., 616-5) is coupled to bit line 614-5. As described in connection with FIG. 3, the memory array 610 may not include an external resistor, for example, between the memory cells 616 and the word line 612 used to perform the material implication operation(s). For example, the material implication operation(s) can be performed without using a resistance (e.g., a load resistor) in addition to that associated with access line decoders (e.g., word and/or bit line decoders).

As used herein, applying a plurality of material implication signals in a particular sequence on a memory cell and another memory cell may refer to applying a plurality of signals 434 and 436 (e.g., or 534 and 536) according to timings described in connection with FIGS. 4B and 5B, in which one memory cell stores a value that is an antecedent and another memory cell stores a value that is a consequent of the material implication operation. For example, applying the plurality of material implication signals on memory cell "p" and memory cell "q" may indicate performing pIMPq.

Figure 6B:
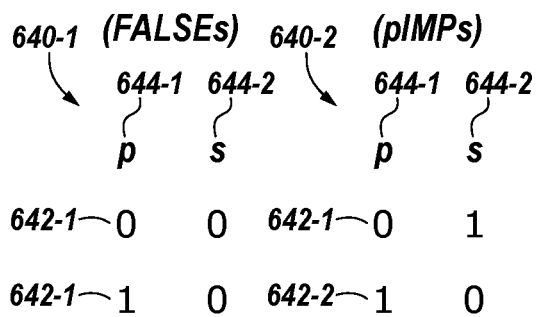

FIG. 6B illustrates truth tables 640-1 and 640-2 showing states of memory cells associated with performing a NOT operation by performing a material implication operation in accordance with a number of embodiments of the present disclosure. Two memory cells (e.g., memory cells p and s) may be utilized for performing a NOT operation, in which a value (e.g., as shown by column 644-1) stored on the memory cell p is an input of the NOT operation (e.g., NOT p).

In this example, column 644-2 of Table 640-1 corresponds to a "FALSE s" operation, which is a first step of the NOT operation and results in the memory cell "s" being programmed to a reset state (e.g., "0") prior to applying a plurality of material implication signals on memory cells "p", "q", and "s. Table 640-2 corresponds to "pIMPs" operation. After performance of the "pIMPs" operation, cell "s" stores the result of "pNOTq" (e.g., as shown in column 644-2 of table 640-2). The memory cell "s" may be programmed to a reset state (e.g., "0") prior to applying a plurality of signals on memory cells "p" and "s"

Subsequent to programming the memory cell s to a reset state (e.g., "0"), the plurality of material implication signals (e.g., signals 434 and 436 and/or 534 and 536) may be applied (e.g., as described in connection with FIGS. 4 and 5) on the memory cells "p" and "s" (e.g., pIMPs). For example, a state of the memory cell s may be changed (e.g., from a reset state "0" to a set state "1") only when the memory cell "p" is programmed to a reset state (e.g., "0").

Table 640-2 shows a resulting states of memory cells "p" and "s" as a result of performing pIMPs. For example, as shown by row 642-1 of table 640-2, the memory cell "s" may be programmed to a set state (e.g., "1") when the memory cell "p" was programmed to a reset state (e.g., "0"). For example, as shown by row 642-3 of table 640-2, the memory cells may remain in a reset state (e.g., "0") when the memory cell p was programmed to a set state (e.g., "1"). Changed states of the memory cell s (e.g., column 644-2 of table 640-2) represents a result of the NOT operation whose input is a value stored on the memory cell p (e.g., column 644-1). As such, a NOT operation may be performed by performing a single material implication operation on two memory cells.

FIG. 6C illustrates truth tables 650-1, 650-2, and 650-3 showing states of memory cells associated with performing a NAND operation (e.g., p NAND q) by performing a number of material implication operations in accordance with a number of embodiments of the present disclosure. Three memory cells (e.g., memory cells "p", "q", and "s") may be utilized for performing a NAND operation, in which values stored on the memory cells "p" and "q" are inputs of the NAND operation (e.g., p NAND q).

In this example, column 654-3 of Table 650-1 corresponds to a "FALSE s" operation, which is a first step of the NAND operation and results in the memory cell "s" being programmed to a reset state (e.g., "0") prior to applying a plurality of material implication signals on memory cells "p", "q", and "s. Table 650-2 corresponds to a "pIMPs" operation performed subsequent to performing the FALSE s operation shown in table 650-1. Table 650-3 corresponds to a "qIMPs" operation performed subsequent to performing the "pIMPs" operation. After performance of the "qIMPs" operation, cell "s" stores the result of "pNANDq" (e.g., as shown in column 654-3 of table 650-4).

Table 650-2 shows resulting states of the memory cells "p", "q", and "s" subsequent to performing pIMPs. For example, as shown by rows 652-1 and 652-2 of table 650-2, the memory cell "s" may be programmed to a set state (e.g., "1") when the memory cell "p" was programmed to a reset state (e.g., "0"). For example, as shown by rows 652-3 and 652-4 of table 650-2, the memory cells may remain in a reset state (e.g., "0") when the memory cell "p" was programmed to a set state (e.g., "1").

Table 650-3 corresponds to a "pIMPq" operation performed subsequent to performing the pIMPs operation shown in table 650-2). Accordingly, as shown in table 650-3, in this example, the state of the memory cell "s" changes (e.g., from a reset state "0" to a set state "1") only when the memory cell "q" is programmed to a reset state (e.g., "0").

Table 650-3 shows a resulting states of memory cell "p", "s", and "q" as a result of performing qIMPs. For example, as shown by rows 652-3 table 650-3, the memory cell "s" may be programmed to a set state (e.g., "1") when the memory cell "q" was programmed, as shown by row 652-3 of table 650-3 to a reset state (e.g., "0"). Changed states of the memory cell "s" (e.g., column 654-3 of table 650-3) represents a result of the NAND operation whose inputs are values stored on the memory cells "p" and "q" (e.g., columns 654-1 and 654-2, respectively). As such, a NAND operation may be performed by performing two material implication operations on three memory cells.

FIG. 6D illustrates truth tables 660-1, 660-2, 660-3, and 660-4 showing states of memory cells associated with performing a NOR operation (e.g., pNORq) by performing a number of material implication operations in accordance with a number of embodiments of the present disclosure. Four memory cells (e.g., memory cells "p", "q", "r", and "s") may be utilized for performing a NOR operation, in which values stored on the memory cells "p" and "q" are inputs of the NOR operation (e.g., p NOR q).

In this example, Table 660-1 corresponds to a "FALSE r" and a "FALSE s" operation, in which cells "r" and "s" are reset such that there values are "0" regardless of the values stored on cells "p" and "q" (e.g., as shown in columns 664-3 and 664-4). Table 660-2 corresponds to a subsequent "pIMPr" operation, table 660-3 corresponds to a subsequent "rIMPq" operation, and table 660-4 corresponds to a subsequent "qIMPs" operation. After performance of the "qIMPs" operation, cell "s" stores the result of "pNORq" (e.g., as shown in column 664-3 of table 660-4). The memory cells "r" and "s" may be programmed to a reset state (e.g., "0") prior to applying a plurality of signals on memory cells "p", "q", "r", and "s".

Subsequent to programming the memory cells "r" and "s" to a reset state (e.g., "0"), the plurality of material implication signals may be applied on the memory cells p and r (e.g., pIMPr). For example, a state of the memory cell "r" may be changed (e.g., from a reset state "0" to a set state "1") only when the memory cell "p" is programmed to a reset state (e.g., "0").

Table 660-2 shows resulting states of the memory cells p", "q", "r", and "s" subsequent to performing pIMPr. For example, as shown by rows 662-1 and 662-2 of table 660-2, the memory cell "r" may be programmed to a set state (e.g., "1") when the memory cell "p" was programmed to a reset state (e.g., "0"). For example, as shown by rows 662-3 and 662-4 of table 660-2, the memory cell "r" may remain in a reset state (e.g., "0") when the memory cell "p" was programmed to a set state (e.g., "1").

Subsequent to performing pIMPr, the plurality of material implication signals may be applied on the memory cells "r" and "q" (e.g., rIMPq). For example, a state of the memory cell "q" may be changed (e.g., from a reset state "0" to a set state "1") only when the memory cell "r" is programmed to a reset state (e.g., "0").

Table 660-3 shows a resulting states of memory cell p", "q", "r", and "s" as a result of performing rIMPq (e.g., that is performed subsequent to pIMPr). For example, as shown by row 662-3 of table 660-3, the memory cell "q" may be programmed to a set state (e.g., "1") when the memory cell "r" was programmed to a reset state (e.g., "0") while the memory cell "q" may remain in a previous state in other scenarios, as shown by rows 662-1, 662-2, and 662-4 of table 660-3.

Subsequent to performing rIMPq, the plurality of material implication signals may be applied on the memory cells "q" and "s" (e.g., qIMPs). For example, a state of the memory cell "s" may be changed (e.g., from a reset state "0" to a set state "1") only when the memory cell "q" is programmed to a reset state (e.g., "0").

Table 660-4 shows a resulting states of memory cell "p", "q", "r", and "s" as a result of performing qIMPs (e.g., that is performed subsequent to rIMPq). For example, as shown by row 662-1 of table 660-4, the memory cell "q" may be programmed to a set state (e.g., "1") when the memory cell "q" was programmed to a reset state (e.g., "0") while the memory cell "s" may remain in a reset state (e.g., "0") otherwise, as shown by rows 662-2, 662-3, and 662-4 of table 660-4. Changed states of the memory cell "s" (e.g., column 664-4 of table 660-4) represents a result of the NOR operation whose input are values stored on the memory cells "p" and "q" (e.g., columns 664-1 and 664-2). As such, a NOR operation may be performed by performing three material implication operations on four memory cells.

Figure 6E:
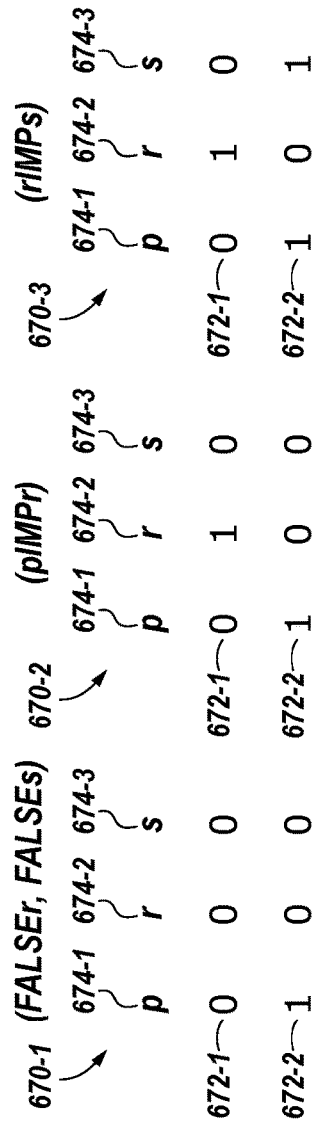

FIG. 6E illustrates truth tables 670-1, 670-2, and 670-3 showing states of memory cells associated with performing a COPY operation by performing a number of material implication operations in accordance with a number of embodiments of the present disclosure. Three memory cells (e.g., memory cells "p", "r", and "s") may be utilized for performing a COPY operation, in which a value stored on the memory cell "p" is an input of the COPY operation (e.g., COPY In this example, Table 670-1 corresponds to a "FALSE r" and a "FALSE s" operation, in which cells "r" and "s" are reset such that their values are "0" regardless of the values stored on the cell "p" (e.g., as shown in columns 674-2 and 674-3). Table 670-2 corresponds to a subsequent "pIMPr" operation and table 670-3 corresponds to a subsequent "rIMPs" operation. After performance of the "rIMPs" operation, cell "s" stores the result of "COPY q" (e.g., as shown in column 674-3 of table 670-3). The memory cells "r" and "s" may be programmed to a reset state (e.g., "0") prior to applying a plurality of signals on memory cells "p", "r", and "s".

Subsequent to programming the memory cells "r" and "s" to a reset state (e.g., "0"), the plurality of material implication signals may be applied on the memory cells "p" and "r" (e.g., pIMPr). For example, a state of the memory cell "r" may be changed (e.g., from a reset state "0" to a set state "1") only when the memory cell "p" is programmed to a reset state (e.g., "0").

Table 670-2 shows resulting states of the memory cells "p", "r", and "s" subsequent to performing pIMPr. For example, as shown by row 672-1 of table 670-2, the memory cell "r" may be programmed to a set state (e.g., "1") when the memory cell "p" was programmed to a reset state (e.g., "0"). For example, as shown by row 672-3 of table 670-2, the memory cell "r" may remain in a reset state (e.g., "0") when the memory cell "p" was programmed to a set state (e.g., "1").

Subsequent to performing pIMPr, the plurality of material implication signals may be applied on the memory cells "r" and "s" (e.g., rIMPs). For example, a state of the memory cell "s" may be changed (e.g., from a reset state "0" to a set state "1") only when the memory cell "r" is programmed to a reset state (e.g., "0").

Table 670-3 shows a resulting states of memory cell "p", "r", and "s" as a result of performing rIMPs (e.g., that is performed subsequent to pIMPr). For example, as shown by row 672-1 of table 670-3, the memory cell "s" may remain in a reset state (e.g., "0") when the memory cell "r" was programmed to a set state (e.g., "1"). For example, as shown by row 672-3 of table 670-2, the memory cell "s" may be programmed to a set state (e.g., "1") when the memory cell "r" was programmed to a reset state (e.g., "0"). Changed states of the memory cell "s" (e.g., column 674-3 of table 670-3) represents a result of the COPY operation whose input is a value stored on the memory cell "p" (e.g., column 674-1). As such, a COPY operation may be performed by performing two material implication operations on three memory cells.

Figure 6F:
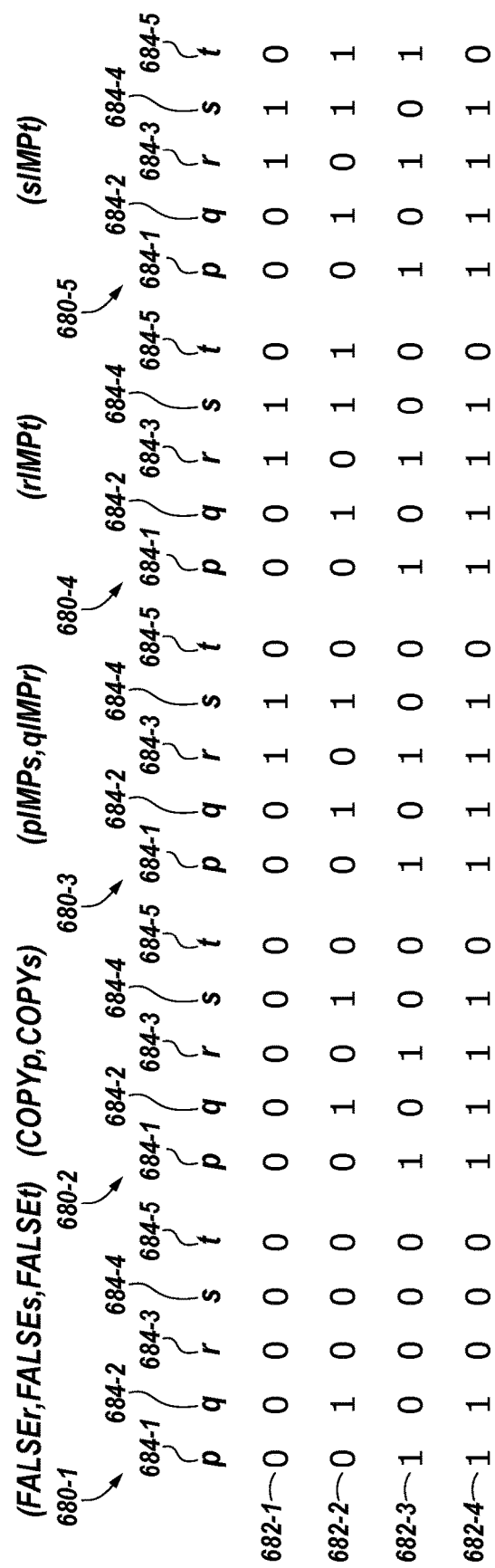

FIG. 6F illustrates truth tables 680-1, 680-2, 680-3, 680-4, and 680-5 showing states of memory cells associated with performing a XOR operation by performing a number of material implication operations in accordance with a number of embodiments of the present disclosure. Three memory cells (e.g., memory cells "p", "q", "r", "s", and "t") may be utilized for performing a XOR operation, in which values stored on the memory cells "p" and "q" are inputs of the XOR operation (e.g., p XOR q).

In this example, Table 680-1 corresponds to a "FALSE r", a "FALSE s", and a "FALSE t" operation, in which cells "r", "s", and "t" are reset such that there values are "0" regardless of the values stored on the cell "p" and "q" (e.g., as shown in columns 684-3, 684-4, and 684-5). Table 680-2 corresponds to a subsequent "COPY p" operation and a subsequent "COPY q" operation. Table 680-3 corresponds a subsequent "pIMPs" operation and a subsequent "qIMPr" operation, table 680-4 corresponds to a subsequent "rIMPt" operation, and table 680-5 corresponds to "sIMPt" operation. After performance of the "sIMPt" operation, cell "t" stores the result of "p XOR q" (e.g., as shown in column 684-5 of table 680-5). The memory cells r and s may be programmed to a reset state (e.g., "0") prior to applying a plurality of signals on memory cells "p", "r", and "s".

Subsequent to programming the memory cells "r", "s", and "t" to a reset state (e.g., "0"), COPY operations may be performed on the memory cells "p" and "q". For example, a value stored on the memory cell "p" may be copied into the memory cell "r" (e.g., as shown by 684-3), and a value stored on the memory cell "q" may be copied into the memory cell "s" (e.g., as shown by 684-4). In a number of embodiments, these COPY operations may be performed using the plurality of material implication signals as described in connection with FIG. 6E.

Subsequent to performing copy operations, the plurality of material implication signals may be applied on the memory cells "p" and "s" (e.g., pIMPs) and on the memory cells "q" and "r" (e.g., qIMPr). For example, a state of the memory cell "s" may be changed (e.g., from a reset state "0" to a set state "1") only when the memory cell "p" is programmed to a reset state (e.g., "0"). For example, a state of the memory cell "r" may be changed (e.g., from a reset state "0" to a set state "1") only when the memory cell "q" is programmed to a reset state (e.g., "0"). Two material implication operations (e.g., pIMPs and qIMPr) may be performed simultaneously and/or sequentially.

Table 680-3 shows resulting states of the memory cells "p", "q", "r", "s", and "t" subsequent to performing pIMPs and qIMPr. For example, as shown by row 682-1 of table 680-3, the memory cell "s" may be programmed to a set state (e.g., "1") when the memory cell "p" was programmed to a reset state (e.g., "0"), and the memory cell "r" was programmed to a reset state (e.g., "1") when the memory cell "q" was programmed to a reset state (e.g., "0").

Subsequent to performing pIMPs and qIMPr, the plurality of material implication signals may be applied on the memory cells "r" and "t" (e.g., rIMPt). For example, a state of the memory cell "t" may be changed (e.g., from a reset state "0" to a set state "1") only when the memory cell "r" is programmed to a reset state (e.g., "0").

Table 680-4 shows a resulting states of memory cell "p", "q", "r", "s", and "t" as a result of performing rIMPt (e.g., that is performed subsequent to pIMPs and qIMPr). For example, as shown by row 682-2 of table 680-4, the memory cell "t" may be programmed to a set state (e.g., "1") when the memory cell "r" was programmed to a reset state (e.g., "0"). For example, as shown by rows 682-1, 682-3, and 682-4, the memory cell "t" may remain in a reset state (e.g., "0") when the memory cell "r" was programmed to a set state (e.g., "1").

Subsequent to performing rIMPt, the plurality of material implication signals may be applied on the memory cells "s" and "t" (e.g., sIMPt). For example, a state of the memory cell "t" may be changed (e.g., from a reset state "0" to a set state "1") only when the memory cell "s" is programmed to a reset state (e.g., "0").

Table 680-5 shows a resulting states of memory cell "p", "q", "r", "s", and "t" as a result of performing sIMPt (e.g., that is performed subsequent to rIMPt). For example, as shown by row 682-3 of table 680-4, the memory cell "t" may be programmed to a set state (e.g., "1") when the memory cell "s" was programmed to a reset state (e.g., "0") while the memory cell "t" may remain in a previous state in other scenarios, as shown by rows 682-1, 682-2, and 682-4 of table 680-4. Changed states of the memory cell "t" (e.g., column 684-4 of table 680-5) represents a result of the XOR operation whose input are values stored on the memory cells "p" and "q" (e.g., columns 684-1 and 684-2). As such, a XOR operation may be performed by performing two copy operations and four material implication operations on five memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a controller coupled to a plurality of memory cells coupled to a first access line and to a plurality of second access lines and configured to perform a Boolean operation at least partially by, while a first signal is being applied to the first access line:
applying a second signal to a first one of the plurality of memory cells via one of the plurality of second access lines; and
applying a third signal to a second one of the plurality of memory cells via another of the plurality of second access lines;
wherein a result of the Boolean operation is stored on the second of the plurality of memory cells subsequent to application of the first signal.

2. The apparatus of claim 1, wherein a voltage magnitude corresponding to the second signal is less than a voltage magnitude corresponding to the third signal.

3. The apparatus of claim 1, wherein the first and the second one of the plurality of memory cells are not coupled to an external load resistor.

4. The apparatus of claim 1, wherein:
the first one of the plurality of memory cells is programmed, prior to the first signal being applied to the first one of the plurality of memory cells, to a reset state; and
the controller is configured to program, by applying the first, the second, and the third signals to the first and the second one of the plurality of memory cells, the second one of the plurality of memory cells to a set state regardless of a data state, prior to the first signal being applied to the second one of the plurality of memory cells, of the second one of the plurality of memory cells.

5. The apparatus of claim 1, wherein:
the first one of the plurality of memory cells is programmed, prior to the first signal being applied to the first one of the plurality of memory cells, to a set state; and
the controller is configured to maintain, by applying the first, the second, and the third signals to the first and the second one of the plurality of memory cells, a data state of the second one of the plurality of memory cells to a same data state prior to the first signal being applied to the second one of the plurality of memory cells.

6. The apparatus of claim 1, wherein:
a voltage differential applied across the first one of the plurality of memory cells corresponds to a magnitude difference between a magnitude of the first and the second one of the plurality of memory cells; and
a voltage differential applied across the first one of the plurality of memory cells corresponds to a magnitude difference between a magnitude of the first and the second one of the plurality of memory cells;
wherein a difference between the voltage differentials applied across the first and the second one of the plurality of memory cells varies based on a data value, prior to the first signal being applied to the first one of the plurality of memory cells, of the first one of the plurality of memory cells.

7. The apparatus of claim 6, wherein:
the first one of the plurality of memory cells is programmed, prior to the first signal being applied to the first one of the plurality of memory cells, to a reset state; and
the voltage differential applied across the first one of the plurality of memory cells is less than the voltage differential applied across the second one of the plurality of memory cells.

8. The apparatus of claim 6, wherein:
the first one of the plurality of memory cells is programmed, prior to the first signal being applied to the first one of the plurality of memory cells, to a set state; and
the voltage differential applied across the first one of the plurality of memory cells is not less than the voltage differential applied across the second one of the plurality of memory cells.

9. The apparatus of claim 1, wherein a value stored on the first one of the plurality of memory cells is an antecedent of the Boolean operation.

10. The apparatus of claim 1, wherein a value stored on the second one of the plurality of memory cells is a consequent of the Boolean operation.

11. An apparatus, comprising:
a plurality of memory cells configured to store respective values that are usable as an antecedent or a consequent, or both; and
a controller coupled to the plurality of memory cells and configured to perform a Boolean operation at least partially by:
applying a first signal to a first access line; and
applying, while the first signal is being applied to the first access line, respective signals to a first and a second of the plurality of memory cells via respective access lines of the plurality of access lines;
wherein the Boolean operation is performable without transferring the respective values out of the plurality of memory cells.

12. The apparatus of claim 11, wherein the controller is configured to apply the third signal while the second signal is being applied.

13. The apparatus of claim 11, wherein the first and the second of the plurality of memory cells are directly coupled to an access line decoder such that a load resistor is not used to perform the Boolean operation.

14. The apparatus of claim 11, wherein the Boolean operation is at least one of:
a material implication operation;
a NOT operation;
a NAND operation;
a NOR operation;
a COPY operation; and
a XOR operation.

15. A method, comprising:
performing a first type of Boolean operation using values stored on a plurality of memory cells coupled to a first access lines and a plurality of second access lines by applying a plurality of signals in a particular sequence, which comprises:
applying, for a first period of time, a first signal to a first access line;

applying, for a second period of time, a second signal to a first of the plurality of second access lines, wherein the second period of time is within the first period of time; and applying, for a third period of time, a third signal to a second of the plurality of second access lines, wherein the third period of time is within the second period of time.

16. The method of claim 15, further comprising performing a second type of Boolean operation using values stored on a first of the plurality of memory cells and a second of the plurality of memory cells having a reset state by:

performing, by applying the plurality of signals in the particular sequence, the first type of Boolean operation using the values stored on the first and the second of the plurality of memory cells;

wherein a result of the second type of Boolean operation is stored on the second of the plurality of memory cells.

17. The method of claim 15, further comprising performing a second type of Boolean operation using values stored on a first of the plurality of memory cells, a second of the plurality of memory cells, and a third of the plurality of memory cells having a reset state by:

performing, by applying the plurality of signals in the particular sequence, the first type of Boolean operation using the values stored on the first and the third of the plurality of memory cells; and performing, by applying the plurality of signals in the particular sequence, the first type of Boolean operation using the values stored on the second and the third of the plurality of memory cells;

wherein a result of the second type of Boolean operation is stored on the third of the plurality of memory cells.

18. The method of claim 15, further comprising performing a second type of Boolean operation using values stored on a first of the plurality of memory cells, a second of the plurality of memory cells, a third of the plurality of memory cells having a reset state, and a fourth of the plurality of memory cells having a reset state by:

performing, by applying the plurality of signals in the particular sequence, the first type of Boolean operation using the values stored on the first and the third of the plurality of memory cells;

performing, by applying the plurality of signals in the particular sequence, the first type of Boolean operation using the values stored on the third and the second of the plurality of memory cells; and performing, by applying the plurality of signals in the particular sequence, the first type of Boolean operation using the values stored on the second and the fourth of the plurality of memory cells;

wherein a result of the second type of Boolean operation is stored on the fourth of the plurality of memory cells.

19. The method of claim 15, further comprising performing a second type of Boolean operation using values stored on a first set of the plurality of memory cells having a first of the first set, a second of the first set having a reset state, and a third of the first set having a reset state by:

performing, by applying the plurality of signals in the particular sequence, the first type of Boolean operation using the values stored on the first and the second of the first set of the plurality of memory cells; and performing, by applying the plurality of signals in the particular sequence, the first type of Boolean operation using the values stored on the second and the third of the first set of the plurality of memory cells;

wherein a result of the second type of Boolean operation is stored on the third of the first set of the plurality of memory cells.

20. The method of claim 19, further comprising performing a third type of Boolean operation using values stored on a second set of the plurality of memory cells having a first of the second set, a second of the second set having a reset state, and a third of the second set having a reset state by:

performing, by applying the plurality of signals in the particular sequence, the second type of Boolean operation using the values stored on the first and the third of the second set of the plurality of memory cells;

performing, by applying the plurality of signals in the particular sequence, the second type of Boolean operation using the values stored on the second and the fourth of the second set of the plurality of memory cells;

performing, by applying the plurality of signals in the particular sequence, the first type of Boolean operation using the values stored one the first and the fourth of the second set of the plurality of memory cells;

performing, by applying the plurality of signals in the particular sequence, the first type of Boolean operation using the values stored one the second and the third of the second set of the plurality of memory cells;

performing, by applying the plurality of signals in the particular sequence, the first type of Boolean operation using the values stored one the third and the fifth of the second set of the plurality of memory cells; and performing, by applying the plurality of signals in the particular sequence, the first type of Boolean operation using the values stored one the fourth and the fifth of the second set of the plurality of memory cells;

wherein a result of the third type of Boolean operation is stored on the fifth of the second set of the plurality of memory cells.

\* \* \* \* \*